United States Patent
Kole et al.

(10) Patent No.: US 6,744,940 B2
(45) Date of Patent: Jun. 1, 2004

(54) SENSOR FOR A RECEIVING DEVICE FOR COOPERATION WITH AN OPTICAL FIBER

(75) Inventors: Marcus Egbert Kole, Eindhoven (NL); Antonius Martinus Van Doorn, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 215 days.

(21) Appl. No.: 10/103,211

(22) Filed: Mar. 21, 2002

(65) Prior Publication Data

US 2002/0136503 A1 Sep. 26, 2002

(30) Foreign Application Priority Data

Mar. 26, 2001 (EP) .............................. 01201113

(51) Int. Cl.[7] ................................................ G02B 6/00
(52) U.S. Cl. ............................. 385/12; 385/14; 385/2; 385/88; 356/345
(58) Field of Search ............................. 385/12, 14, 88, 385/2; 356/345

(56) References Cited

U.S. PATENT DOCUMENTS

| | | | |
|---|---|---|---|
| 5,400,142 A | * | 3/1995 | Lavin ......................... 356/464 |
| 5,439,647 A | * | 8/1995 | Saini ....................... 422/82.11 |
| 5,978,525 A | * | 11/1999 | Shu et al. ..................... 385/12 |
| 6,204,920 B1 | * | 3/2001 | Ellerbrock et al. ......... 356/477 |
| 6,483,104 B1 | * | 11/2002 | Benz et al. ............. 250/231.13 |
| 6,490,038 B1 | * | 12/2002 | Jung et al. .................. 356/419 |
| 2002/0034351 A1 | * | 3/2002 | Wickman et al. .............. 385/2 |

OTHER PUBLICATIONS

Novotny et al: "Field Effect Transistor–Self Electooptic Effect device (FET–SEED) Differential Transimpedance Amplifiers For Two–Dimensional Optical Data Links" Journal of Lightwave Technology, IEEE, vol. 13, No. 4, Apr. 1, 1995, pp. 606–613.
Yap et al: "Integrated optoelectronic circuits with InP–based HBTs" Optoelectronic Integrated Circuits And Packaging V, Jan. 24–26, 2001, vol. 4290, pp. 1–11.
Patent Abstracts of Japan, Andoriyuu Robaatoson: "Image Processor," Publication No. 04360284, Dec. 14, 1992, Application No. 03134827, Jun. 6, 1991.

* cited by examiner

Primary Examiner—Brian Healy
Assistant Examiner—Eric Wong
(74) Attorney, Agent, or Firm—Aaron Waxler

(57) ABSTRACT

Receiving device for cooperation with an optical fiber and comprising a sensor for converting a signal in the form of a modulated beam outputted by the optical fiber into an electric signal. The sensor comprises two or more mutually separated sensor elements. An output of each sensor element) is coupled to an amplifying element, which is coupled to an analog to digital converter associated with the amplifying element. The sensor elements and the amplifying elements connected thereto are provided on a single semiconductor chip. The analog to digital converters may also be provided on the semiconductor chip. The integrated circuits on the semi conductor chip are clock-controlled and a clock rate for the integrated circuits is lower than a clock rate corresponding to the bit transfer rate of the modulated beam. Means are present for reconstructing the signals in the beam from signals delivered by the sensor elements at the clock rate for the integrated circuits.

15 Claims, 2 Drawing Sheets

SENSOR FOR A RECEIVING DEVICE FOR COOPERATION WITH AN OPTICAL FIBER

The invention relates to a sensor for a receiving device for cooperation with an optical fiber for converting a beam form signal outputted by the optical fiber into an electric signal, the sensor comprising two or more mutually separated sensor elements.

The invention also relates to a receiving device for cooperation with an optical fiber, comprising said sensor for converting a signal in the form of a modulated beam exiting the optical fiber into an electric signal.

Such a sensor is known from a Japanese patent application JP-A-111351818 laid open to public inspection. Said document discloses a two-dimensional sensor in which the sensor elements are temperature sensors which undergo a temperature change upon being hit by the beam exiting the optical fiber, which temperature change can be detected by the processing electronics that are provided. Each sensor element comprises a first and a second temperature sensor. The sensor elements are arranged in rows and columns. All the first temperature sensors of a row are interconnected, and all the second temperature sensors of a column are interconnected. The interconnected temperature sensors are coupled to a voltage detector. By detection which row and which column deliver the signal different from that delivered by the other rows and columns it can be determined at what sensor position the beam hit the sensor.

Such a sensor is not suitable at all for converting information present in the beam into a different type of signal.

Fiber-optical communication systems are capable of supporting signals having relatively high widths, and high bit rates, respectively, for example 2.5 GHs to 4 GHs for SONET applications. In existing fiber-optical communication systems, the electrical components are bit-serial: a single laser diode or LED for generating the optical signal transmitted through the optical fiber, a single PIN diode for detecting the beam exiting the optical fiber and multiple high-speed bipolar or GaAs circuits for processing the signals which control the laser diode or LED or which originate from the PIN photo diode. Such electrical components are costly and the described signal chain cannot be further integrated by using the process technology by means of which they are manufactured.

In existing fiber-optical receiver chains it is known to implement said further processing electronics in a multipath structure, in which parallel processing of signals can take place, after the beam has been detected by means of the PIN photo diode and has been coupled to said further processing electronics via an initial bipolar or GaAs detector chip.

In spite of the parallel processing in the further path, the known receiver chains are still limited by the fact that only one PIN photo diode is present for detecting the single beam outputted by the optical fiber and converting it into an electric signal. High speed operating devices suitable for working with the above-mentioned signals are expensive.

It is therefore an object of the invention to provide a sensor being capable of handling said signals using cheaper technology.

According to the invention, this object is achieved in that an output of each sensor element is coupled to an input of an amplifying element, an output of each amplifying element is coupled to an input of an analog to digital converter associated with the amplifying element, and in that the sensor elements and the amplifying elements coupled thereto are provided on a single semiconductor chip.

As a result, the same eceiving area, subdivided in multiple small sensor elements, is obtained for sensors for which so far one large PIN photodiode was required in order to generate a sufficiently strong signal, with the inherent drawback that the large capacitance resulted in a poor performance at high frequencies. Each of said smaller sensor elements has its own amplifying element and only a small capacitance is present for each sensor element, so that a satisfactory performance is possible at high frequencies as well, while the size of the total sensitive surface area does not differ from the size of the sensitive surface area of the known PIN photodiode.

In an embodiment of a sensor according to the invention the analog to digital converters are arranged on the semiconductor chip.

As a result, the signal detection from the beam exiting the fiber including the digitization of the electric signals is realized at a relatively high rate, at high frequencies, on a single chip, and in parallel.

In another embodiment of a sensor according to the invention the sensor elements are arranged within a predetermined area on the semiconductor chip, and the spatial density of sensor elements in said predetermined area is substantially constant.

As a result, the output signals from the various sensor elements exhibit a high degree of uniformity.

Another result is that less stringent requirements are imposed on the optical treatment of the beam outputted by the optical fiber.

In an embodiment a receiver device designed for cooperation with an optical fiber and comprising a sensor for converting a signal in the form of a modulated beam outputted by the optical fiber is presented. The device comprises the sensor as described above, the circuits on the semiconductor chip are clock-controlled, a clock rate for the circuits is lower than a clock rate corresponding to the bit transfer rate of the modulated beam, means for reconstructing the signals in the beam from signals delivered by the sensor elements at the clock rate for the circuits are present.

As a result, the frequency requirements imposed on the technology for the circuits on the single semiconductor chip of the sensor are less stringent than the requirements imposed to each individual sensor element for detecting the modulation in the exiting modulated beam.

In another embodiment of the sensor elements are organized in groups, the reconstruction means comprising control means which are arranged for reading the sensor elements in groups, and the number of groups being substantially equal to the ratio between the clock rate corresponding to the bit transfer rate of the modulated beam and the clock rate for the integrated circuits.

As a result, it is possible to detect signals that are present in the outputting beam at a frequency which is much higher than a first maximum frequency, using a technology that is suitable for said first maximum frequency.

The invention will now be described in more detail with reference to the accompanying drawings, in which:

FIG. 1 diagrammatically shows in cross-sectional view a sensor according to the invention;

FIG. 2 diagrammatically shows a sensor element comprising processing electronics;

Figure 1:
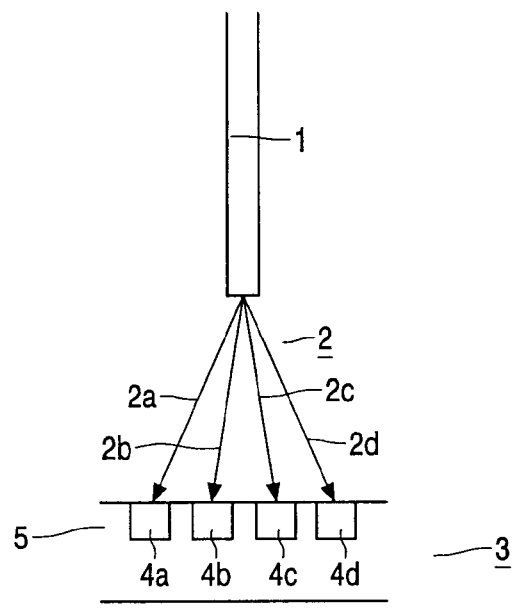

In FIG. 1, reference numeral 1 indicates an optical fiber. A beam 2 is outputted by the optical fiber 1, which beam being subject to dispersion in transverse direction, which is indicated by the arrows 2a, 2b, 2c and 2d. A sensor 3 comprises a number of sensor elements which are sensitive to the radiation in the beam 2 and which are indicated by the reference numerals 4a, 4b, 4c and 4d. Hereinafter, the sensor elements will also be referred to as sensor elements 4. The surface area of the sensor 3 covered by the beam 2 is entirely covered with individual sensor elements 4. Preferably, the sensor elements 4 are arranged in a regular pattern in the predetermined area where the beam 2 hits the sensor 3. As a result, the spatial density of sensor elements in said predetermined area is substantially constant and the dimension of the photosensitive area is substancially the same for each of the sensor elements 4. The sensor 3 comprises a substrate 5 of a semiconductor chip in which the sensor elements 4 are provided. Besides the sensor elements 4, also amplifying elements connected thereto and any elements of a subsequent chain are arranged on the semiconductor chip.

Figure 2:

All this is diagrammatically illustrated in FIG. 2. A sensor element 4 is indicated "PD" and an amplifying element for converting an amount of charge on the sensor element PD into a voltage is indicated "A". An output of the amplifying element A is subsequently coupled to an input of an analog to digital converter B. The elements PD, A and B shown in FIG. 2 are integrated in the sensor 3, which will be referred to as semiconductor chip 3 hereinafter, in a manner which is known per se. The sensor elements 4, hereinafter also referred to as the sensor element PD, are small in size in comparison with the spot projected onto the semiconductor chip 3 by the beam 2.

Figure 3:
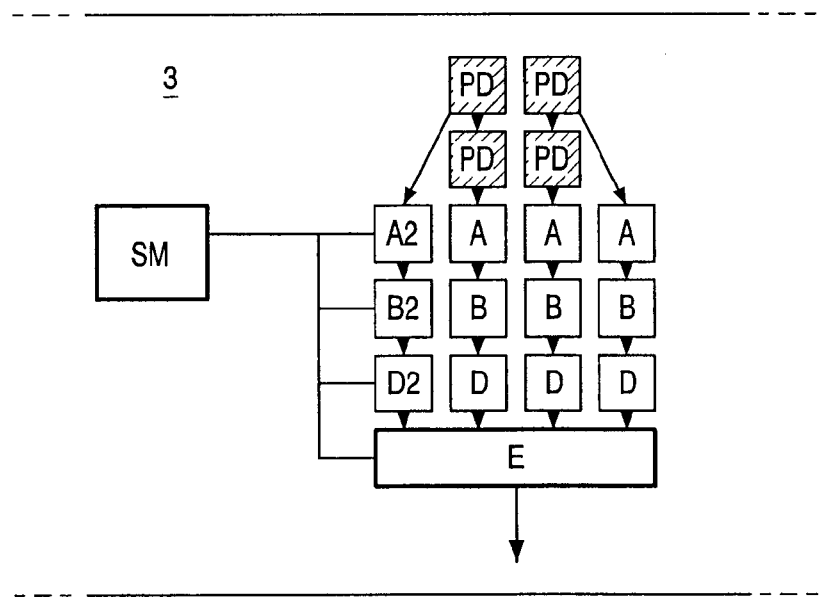
FIG. 3 shows the geometry of a first embodiment of a sensor.

FIG. 3 shows a basic structure of the sensor elements PD and the associated following circuits which are integrated in the semiconductor chip 3. FIG. 3 shows the principle of the spatial arrangement of the various elements. The advantage of the spatial arrangement of the various elements, referred to by the term circuits as far as the elements A, B, D and E are concerned, is that it is possible to cover a larger adjoining "tileable" area of sensor elements PD with the illustrated configuration. The configuration illustrated in FIG. 3 shows the most far-reaching form of integration of circuits on the semiconductor chip 3, namely the sensor elements PD, the amplifying elements A, the digital to analog converters B, time delaying elements D, a reconstruction filter E and control means SM. As was noted in connection with FIG. 2, each sensor element PD is coupled to an input of an amplifying element A, an output of which is coupled to an input of a digital to analog converter B, an output of which is coupled to an input of a time-delaying element D, an output of which is coupled to an input of a reconstruction filter E. As shown in FIG. 3, four sensor elements PD lead to four chains PD-A-B-D, and said four chains are coupled to four inputs of the reconstruction filter E. The control means SM are coupled to each of the chains as well as to the reconstruction filter E. The connection to the chains A2, B2 and D2 is shown explicitly by way of example. Naturally, comparable connections to the other chains are present, but they are not shown for the sake of clarity.

The operation of the four sensors and the chains and the reconstruction filter connected thereto is as follows. The four sensor elements PD are hit by the beam 2 outputted the optical fiber 1. It will be assumed by way of example that the spot on the semiconductor chip 3 produced by the beam 2 is approximately circular in shape and has approximately the same dimensions as the area defined by the sensor elements PD in FIG. 3. In that case each of the sensor elements PD delivers an electric signal in the form of stored charge which is dependent on the intensity of the beam in that location. If the sensitive areas of the sensor elements PD are identical in size and if the beam 2 is evenly distributed over the sensor elements PD, the signals outputted by the sensor elements PD are substantially identical. The modulation of the beam 2 requires a sampling rate of N samples per second in order to enable a full reconstruction as an electric signal. It will be demonstrated further below that the clock rate for the control signals which are supplied by the control means SM to the amplifying elements A, the digital to analog converters B, the time-delaying elements D, and the reconstruction filter E correspond to a sampling rate of N/4 samples per second. This is achieved in the following manner. The control means SM control the amplifying implements A in succession and in a cyclic manner at a frequency N/4. As a result, each of the sensor elements PD can carry out the conversion of the beam 2 into a charge across a capacitance during four sampling periods 1/N, in all four 1/N periods. After each period 1/N, a next sensor element PD is read out by the associated amplifying element A. After four periods 1/N, the sensor element PD that was read out first is read out again. This procedure is repeated continuously. The transfer of the voltage from the outputs of the amplifying elements A to the digital to analog converters B takes place at the same rate N/4. As a result, four different signals are present at the outputs of the digital to analog converters B, because the associated sensor elements PD have been read out at four different points in time. The output signals from the digital to analog converters B each contain the information that corresponds to four samples of the signal in the beam 2. Not all four different samples which form the digital signal at the output of a first digital to analog converter, however, are identical to the four samples which are present in the digital signal at the output of the next digital to analog converter, etc., but a certain amount of overlap does occur. This means that the samples of the signal in the beam 2 which are present in the digital signal at the output of a first digital to analog converter are in part also present in the digital signal at the output of each of the three other digital to analog converters. The later said other digital to analog converters are read out, however, the less significant said presence will be.

The time-delaying circuits D arrange for a combination of digital signals to be present at the outputs of the time-delaying circuits D at all times, which signals are different from the digital signals present at the outputs of the digital to analog converters B at the same point in time, but which enable the reconstruction filter E, which is known per se, to reconstruct the signals which were present in the modulated beam 2 in the correct manner again.

By correctly arranging a number of the circuits and sensor elements shown in FIG. 3 on the semiconductor chip, it is possible to obtain a device comprising eight, twelve, sixteen, etc. sensor elements PD covering a larger surface area, or a larger number of sensor elements having a correspondingly smaller capacitance per sensor element, and consequently a greater bandwidth given the same surface area.

Figure 4:
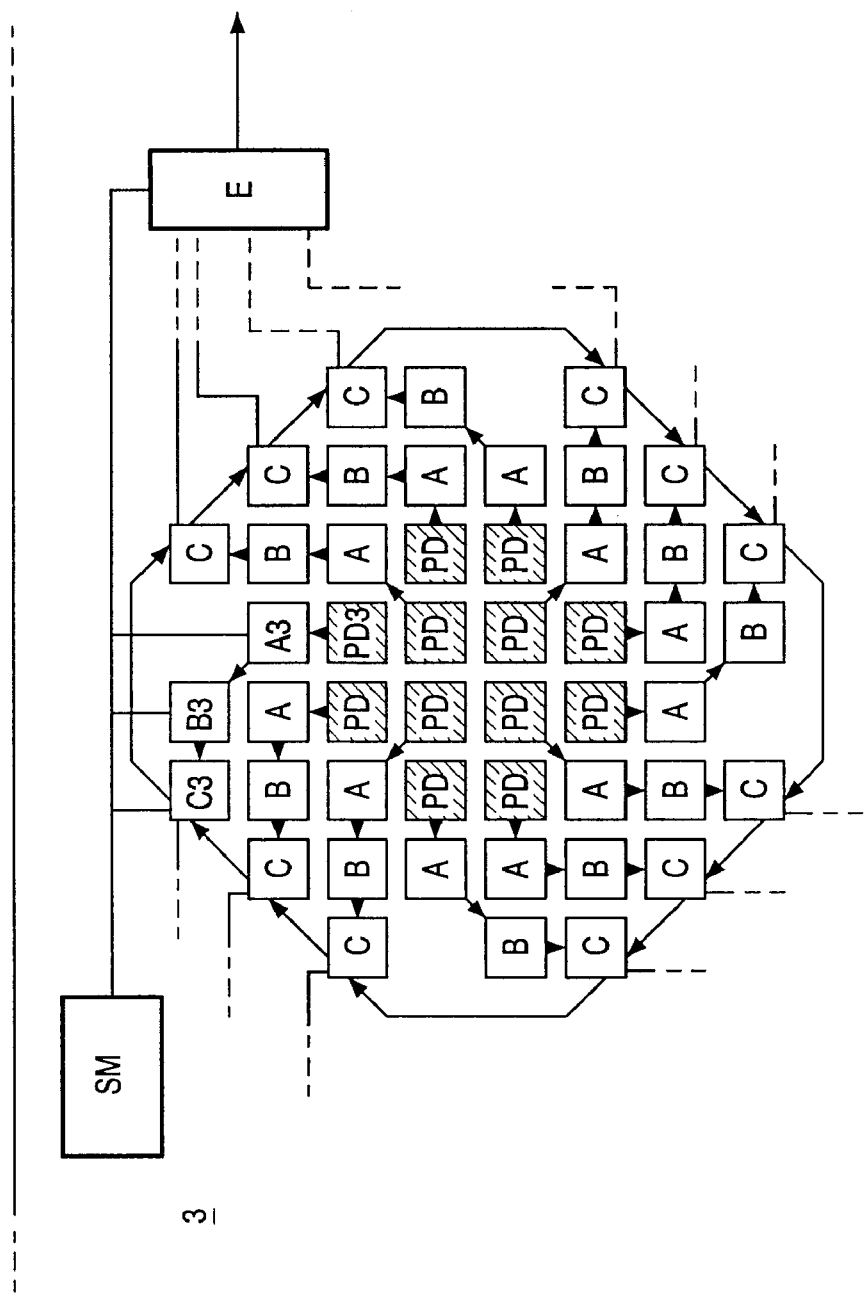
FIG. 4 shows the geometry of a second embodiment of the sensor.

FIG. 4 shows a second embodiment of a sensor according to the invention. Again, the letters PD indicate the sensitive sensor elements, A indicates amplifying elements, and B indicates analog to digital converters. An output of each analog to digital converter is coupled to a shift register C in this embodiment. In the embodiment shown in FIG. 4, twelve sensor elements PD are arranged in one row of two sensor elements, two rows of four sensor elements and another row of two sensor elements. The area defined by the sensor elements is approximately circular. By increasing the number of sensor elements a more precise approximation of the circle can be achieved than is possible with the twelve sensor elements shown in FIG. 4.

The operation of the circuit shown in FIG. 4 is as follows. Twelve sensor elements PD are present. This means that the clock rate of the indicated control means SM can be $\frac{1}{12}$ of a clock rate corresponding to the sampling frequency of the signals in the beam 2. The sensor elements PD are read out one by one by the associated amplifying elements A. Each sensor elements PD is reset to its starting condition immediately after being read out. A sensor element is only read out once in every twelve periods of the clock rate corresponding to the sampling frequency. The consequence of this is that each sensor element can integrate the amount of incident radiation from the beam 2 during twelve such periods. During that period, twelve different sampling points of the signal in the beam 2 have been combined in said one sensor element. The amplifier A converts the charge into a voltage, and said voltage is subsequently converted into a digital rendering of the said voltage by the associated analog to digital converter B. The results of the analog to digital conversions are stored in the shift registers C. The contents of the shift registers are shifted one position with every read-out of one of the sensor elements PD. After a cycle of twelve read-outs, the shift registers contain the twelve values which have been read and converted during that cycle. During the next cycle, the preceding values are overwritten, so that said preceding values must be read in the next signal processing chain. The precise order in which the sensor elements PD are read out follows from the limitations which are imposed by the shift register. The signal processing portion of the chain, i.e. from the sensor elements PD up to and including the analog to digital converters B, is controlled at a clock rate which is a factor of 12 lower than the clock rate corresponding to the sampling frequency of the signal in the optical beam.

In the foregoing, each sensor element PD had its own amplifying element and its own digital to analog converter, followed by its own time delaying element or shift register. If circumstances permit or require so, for example because the sensor is used in an environment in which the bit transfer rate is less than the maximum which the sensor according to the invention is capable of handling, two or more sensor elements PD may be interconnected so as to form one larger sensor. Such sensor elements are read out in groups, and the signal from the group of sensor elements PD are further processed in the same manner as described above for the situation in which each group comprises only one sensor element. The read-out in groups may also take place at a point located further down the chain, for example after the amplifying element or after the digital to analog conversion.

After the foregoing, various modifications and embodiments will be apparent to a person skilled in the art. All such embodiments and modifications are considered to fall within the scope of the invention.

What is claimed is:

1. A sensor (3) for a receiving device for cooperation with an optical fiber (1) for converting a beam formed signal (2) outputted by the optical fiber into an electric signal, the sensor (3) comprises two or more mutually separated sensor elements (4a, 4b, 4c, 4d, PD), said sensor (3) being characterized in that an output of each sensor element (4a, 4b, 4c, 4d, PD) is coupled to an input of an amplifying element (A), an output of each amplifying element (A) is coupled to an input of an analog to digital converter (B) associated with the amplifying element, said sensor elements (4a, 4b, 4c, 4d, PD) and said amplifying elements coupled thereto are provided on a single semiconductor chip.

2. A sensor (3) as claimed in claim 1, wherein the analog to digital converters (B) are arranged on the semiconductor chip.

3. A sensor (3) as claimed in claim 1, wherein an output of each analog to digital converter (B) is coupled to a shift register (C).

4. A sensor (3) as claimed in claim 1, wherein an output of each analog to digital converter (B) is coupled to an input of a delaying element (D), outputs of the delaying elements (D) being coupled to a reconstruction filter (E).

5. A sensor (3) as claimed in claim 4, wherein the delaying elements (D) are integrated on the semiconductor chip.

6. A sensor (3) as claimed in claim 4, wherein the reconstruction filter (E) is integrated on the semiconductor chip.

7. A sensor (3) as claimed in claim 1, wherein the sensor elements (4a, 4b, 4c, 4d, PD) are arranged within a predetermined area on the semiconductor chip, a spatial density of the sensor elements (4a, 4b, 4c, 4d, PD) in said predetermined area being substantially constant.

8. A sensor (3) as claimed in claim 7, wherein the sensor elements (4a, 4b, 4c, 4d, PD) are arranged in a regular pattern.

9. A sensor (3) as claimed in claim 1, wherein the sensitive areas of all sensor elements (4a, 4b, 4c, 4d, PD) are substancially equal to each other.

10. A receiving device for cooperation with an optical fiber (1), comprising a sensor (3) as claimed in claim 1.

11. A device as claimed in claim 10, wherein the circuits (A, B, C, D) on the semiconductor chip are clock-controlled, a clock rate for the integrated circuits (A, B, C, D) being lower than a clock rate corresponding to a bit transfer rate of the modulated beam (2), the device providing means (E) for reconstructing the signals in the beam (2) from signals delivered by the sensor elements (4a, 4b, 4c, 4d, PD) at the clock rate for the integrated circuits (A, B, C, D).

12. A device as claimed in claim 11, wherein the sensor elements (4a, 4b, 4c, 4d, PD) are organized in groups, the reconstruction means (E) comprise control means (SM) which are arranged for reading the sensor elements (4a, 4b, 4c, 4d, PD) in groups, the number of groups being substantially equal to the ratio between the clock rate corresponding to the bit transfer rate of the modulated beam (2) and the clock rate for the circuits (A, B, C, D).

13. A device as claimed in claim 12, wherein said control means (SM) are arranged for reading out the groups at different points in time.

14. A device as claimed in claim 12, wherein each group comprises one sensor element (4a, 4b, 4c, 4d, PD).

15. A device as claimed in claim 12, wherein the control means (SM) are arranged on the semiconductor chip.

* * * * *